(12) United States Patent
Huang et al.

(10) Patent No.: US 11,645,953 B2
(45) Date of Patent: May 9, 2023

(54) METHOD FOR MANUFACTURING FLEXIBLE DISPLAY DEVICE

(71) Applicant: InnoLux Corporation, Miao-Li County (TW)

(72) Inventors: Hsin-Hao Huang, Miao-Li County (TW); Chu-Hong Lai, Miao-Li County (TW); Yu-Chih Tseng, Miao-Li County (TW)

(73) Assignee: InnoLux Corporation, Miao-Li County (TW)

(*) Notice: Subject to any disclaimer, the term of this patent is extended or adjusted under 35 U.S.C. 154(b) by 0 days.

(21) Appl. No.: 17/727,816

(22) Filed: Apr. 25, 2022

(65) Prior Publication Data

US 2022/0254282 A1  Aug. 11, 2022

Related U.S. Application Data

(62) Division of application No. 17/099,805, filed on Nov. 17, 2020, now Pat. No. 11,348,489.

(30) Foreign Application Priority Data

Dec. 19, 2019 (CN) .......................... 201911317642.3

(51) Int. Cl.
*G02F 1/1333* (2006.01)
*G09F 9/30* (2006.01)
*H05K 1/18* (2006.01)

(52) U.S. Cl.
CPC ........ *G09F 9/301* (2013.01); *G02F 1/133305* (2013.01); *H05K 1/189* (2013.01); *H05K 2201/0332* (2013.01); *H05K 2201/10136* (2013.01)

(58) Field of Classification Search
CPC .................... G09F 9/301; H05K 1/189; H05K 2201/0332; H05K 2201/10136; H05K 2201/10121; G09G 3/3266; G09G 2310/00; G09G 2300/00; G09G 2300/0408; G09G 2380/02; G02F 1/13454; G02F 1/133305; G02F 1/133368; G02F 2201/56; G06F 1/1616; G06F 1/1652
See application file for complete search history.

(56) References Cited

U.S. PATENT DOCUMENTS 9,620,455 B2 * 4/2017 Pagaila ................... H01L 25/50
2010/0323147 A1 12/2010 Yamamoto
(Continued)

FOREIGN PATENT DOCUMENTS

CN 110235242 A 9/2019
JP 2003-280543 A 10/2003

*Primary Examiner* — Mariam Qureshi
(74) *Attorney, Agent, or Firm* — Winston Hsu

(57) ABSTRACT

The present disclosure provides a method for manufacturing the flexible display device. The method for manufacturing the flexible display device includes the following steps. First, a flexible substrate and a bonding structure are provided, in which the bonding structure is disposed on the flexible substrate. Subsequently, an anisotropic conductive film is provided on the bonding structure. Then, a driving circuit is provided on the anisotropic conductive film. Thereafter, the anisotropic conductive film is cured at a bonding temperature greater than or equal to 140° C. and less than or equal to 165° C.

7 Claims, 9 Drawing Sheets

(56) References Cited

U.S. PATENT DOCUMENTS

| | | | |
|---|---|---|---|
| 2014/0179065 A1* | 6/2014 | Lee | G02F 1/13452 |
| | | | 438/119 |
| 2016/0274405 A1* | 9/2016 | Du | G02F 1/13439 |
| 2017/0310020 A1* | 10/2017 | Hirayama | C23C 18/1889 |
| 2020/0201392 A1* | 6/2020 | Yu | H01L 27/322 |
| 2020/0373276 A1* | 11/2020 | Lee | H01L 24/83 |
| 2021/0181815 A1* | 6/2021 | Tomizawa | G02F 1/13452 |
| 2021/0212212 A1 | 7/2021 | Chen | |

\* cited by examiner

METHOD FOR MANUFACTURING FLEXIBLE DISPLAY DEVICE

CROSS REFERENCE TO RELATED APPLICATIONS

This application is a division of U.S. application Ser. No. 17/099,805, filed on Nov. 17, 2020. The content of the application is incorporated herein by reference.

BACKGROUND OF THE DISCLOSURE

1. Field of the Disclosure

The present disclosure relates to a method for manufacturing the flexible display device, and more particularly to a method for manufacturing a flexible display device having a flexible substrate.

2. Description of the Prior Art

Flexible display devices are widely used in daily life, and display panels of the flexible display devices may be driven by integrated circuit chips and flexible circuit boards. Therefore, how to improve a quality of electrical connections between the integrated circuit chips and the display panels or between the flexible circuit boards and the display panels in the flexible display device or a display quality or a reliability of the flexible display device is one of many topics required for discussion and further research in the field.

SUMMARY OF THE DISCLOSURE

According to an embodiment of the present disclosure, a method for manufacturing a flexible display device is provided. First, a flexible substrate and a bonding structure are provided, wherein the bonding structure is disposed on the flexible substrate. Subsequently, an anisotropic conductive film is provided on the bonding structure. Next, a driving circuit is provided on the anisotropic conductive film. Then, the anisotropic conductive film is cured, wherein a bonding temperature of the anisotropic conductive film is greater than or equal to 140° C. and less than or equal to 165° C.

These and other objectives of the present disclosure will no doubt become obvious to those of ordinary skill in the art after reading the following detailed description of the embodiment that is illustrated in the various figures and drawings.

DETAILED DESCRIPTION

Figure 1A:
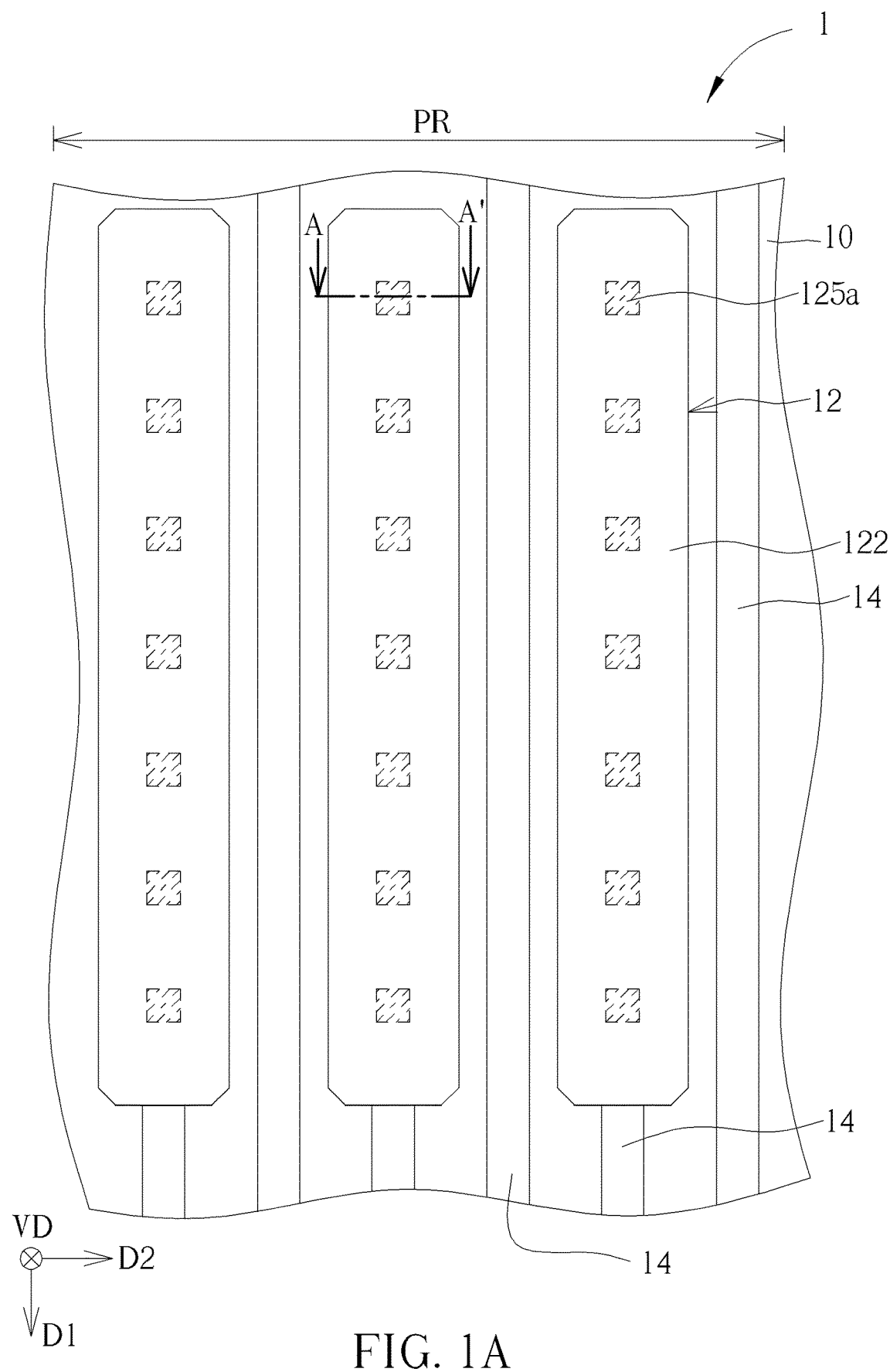
FIG. 1A schematically illustrates a top view of a flexible substrate and a bonding structure according to an embodiment of the present disclosure.

The present disclosure may be understood by reference to the following detailed description, taken in conjunction with the figures as described below. It is noted that, for purposes of illustrative clarity and being easily understood by the readers, various figures of this disclosure may merely show a portion of a flexible display device, and certain elements within may not be drawn to scale. In addition, the number and dimension of each element shown in the figures are illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not in function. In the following description and in the claims, the terms "include", "comprise" and "have" are used in an open-ended fashion, and thus should be interpreted to mean "include, but not limited to . . . ".

It should be understood that, when an element or a layer is "disposed on" or "connected to" another element or layer, it may be directly connected to the another element or layer, or other elements or layers may be inserted therebetween (indirect conditions). Conversely, when an element is "directly connected to" or "directly disposed on" another element or layer, no other elements or layers are inserted therebetween.

Although terms such as first, second, etc. may be used in the description and following claims to describe various elements in claims, these terms do not mean or represent the claimed elements follow certain order and do not represent the order of one claimed element and another claimed element, or their manufacturing sequence. These terms are used to discriminate a claimed element with a denomination from another claimed element with the same denomination.

It should be noted that the technical features in different embodiments described in the following description may be replaced, recombined, or mixed with one another to constitute another embodiment without departing from or conflicting with the spirit of the present disclosure.

The electronic device of the present disclosure may include a display device, an antenna device, a sensing device, a light-emitting device, or a tiled device but not limited thereto. The electronic device may include a bendable or flexible electronic device. The electronic device may for example include liquid crystal materials, light-emitting diodes, fluorescent materials, phosphors, other suitable materials, or combinations of the aforementioned materials or devices and not limited thereto. The light-emitting diode may for example include an organic light-emitting diode (OLED), a sub-millimeter sized light-emitting diode (mini LED), a micrometer-sized light-emitting diode (micro LED), a quantum dot light-emitting diode (quantum dot LED, QLED, or QDLED), a nano-wire light-emitting diode (nano-wire LED) or a bar-type light-emitting diode. The description below uses a display device as an example of the electronic device to illustrate features of the present disclosure, but the present disclosure is not limited thereto.

Figure 1B:
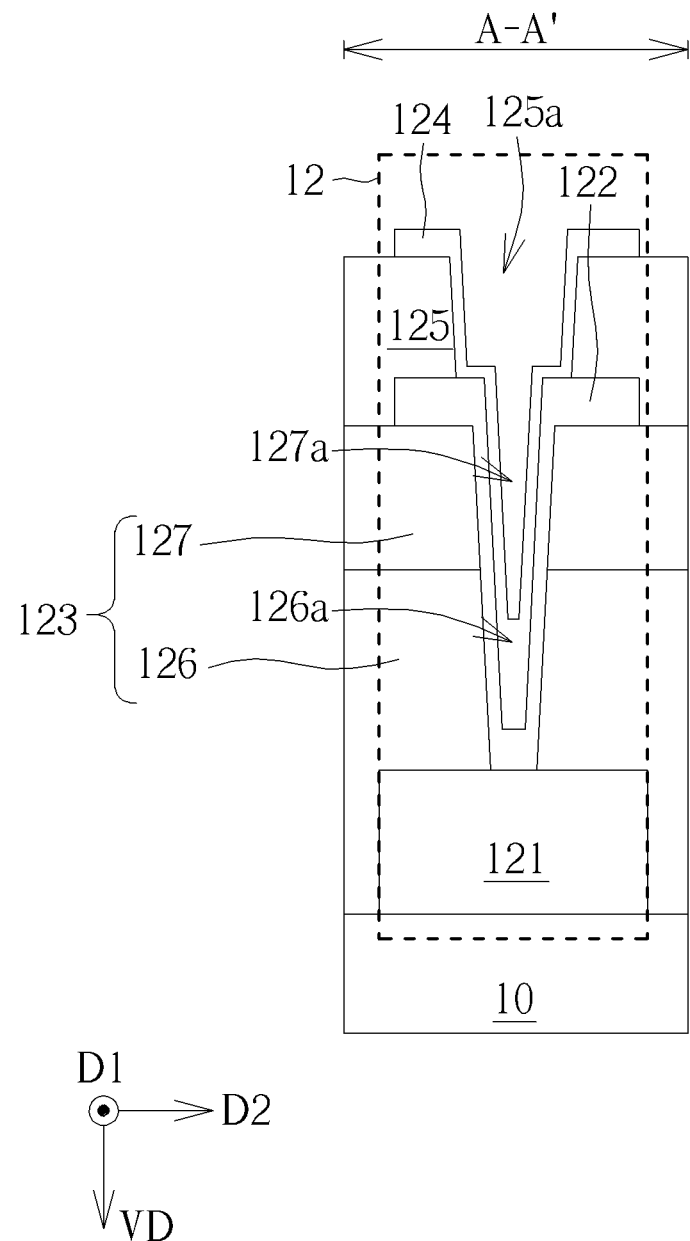
FIG. 1B schematically illustrates a cross sectional view along a sectional line A-A' of FIG. 1A.
Figure 1B:
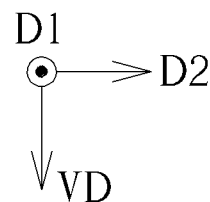
Figure 1C:
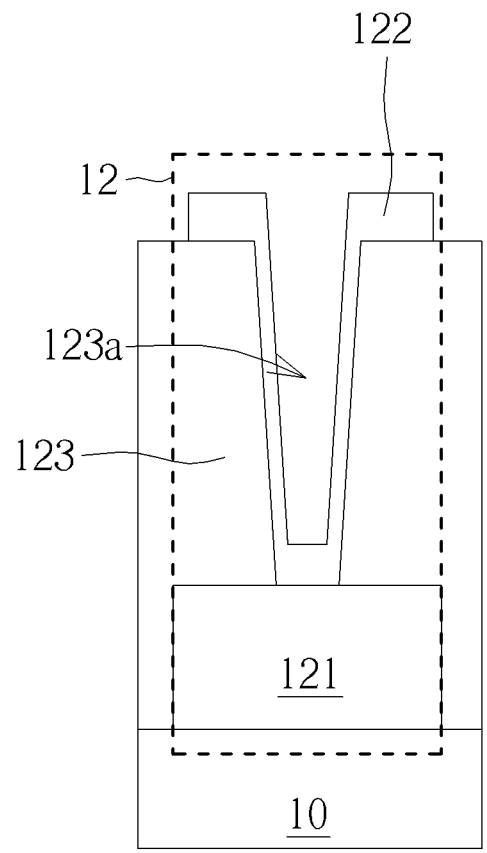
FIG. 1C schematically illustrates a cross sectional view of the flexible substrate and the bonding structure corresponding to the sectional line A-A' of FIG. 1A according to some embodiments of the present disclosure.
Figure 1C:
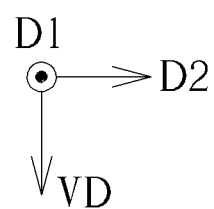
Figure 2:
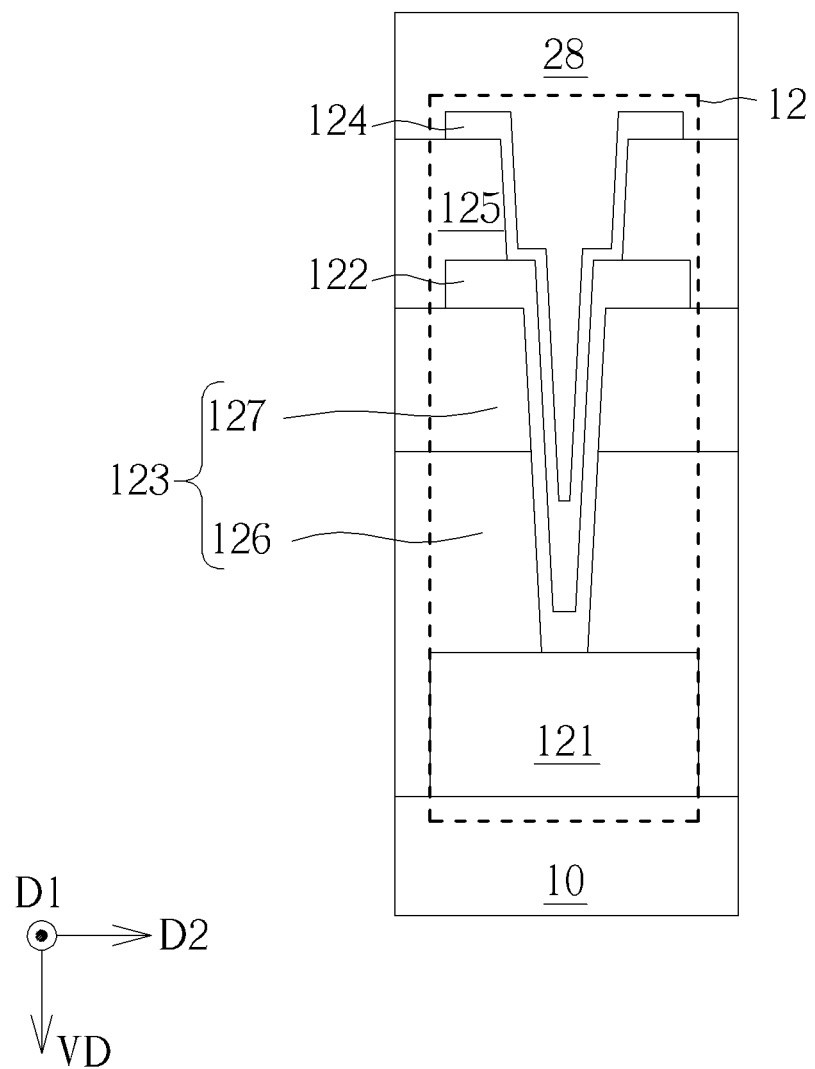
FIG. 2 schematically illustrates a cross sectional view of the bonding structure provided with an anisotropic conductive film.
Figure 3A:
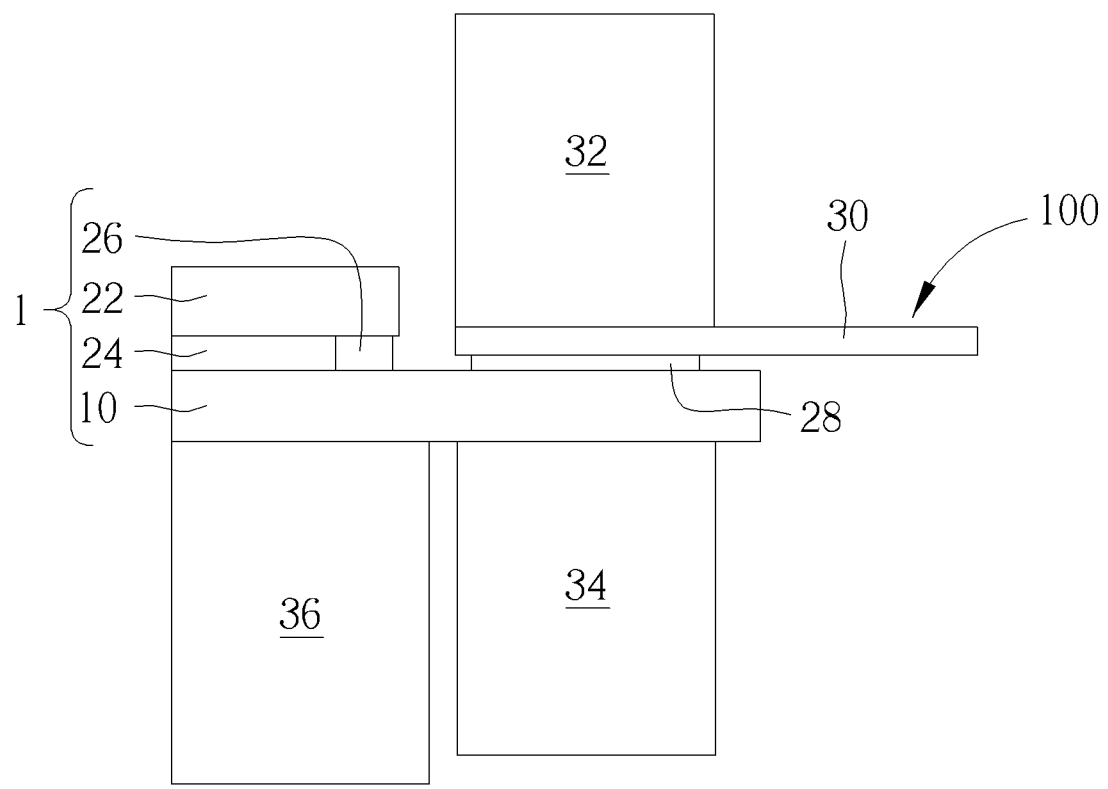
FIG. 3A and FIG. 3B schematically illustrate a cross sectional view of the anisotropic conductive film being cured and a cross sectional view of a driving circuit provided on the anisotropic conductive film, respectively.
Figure 3B:
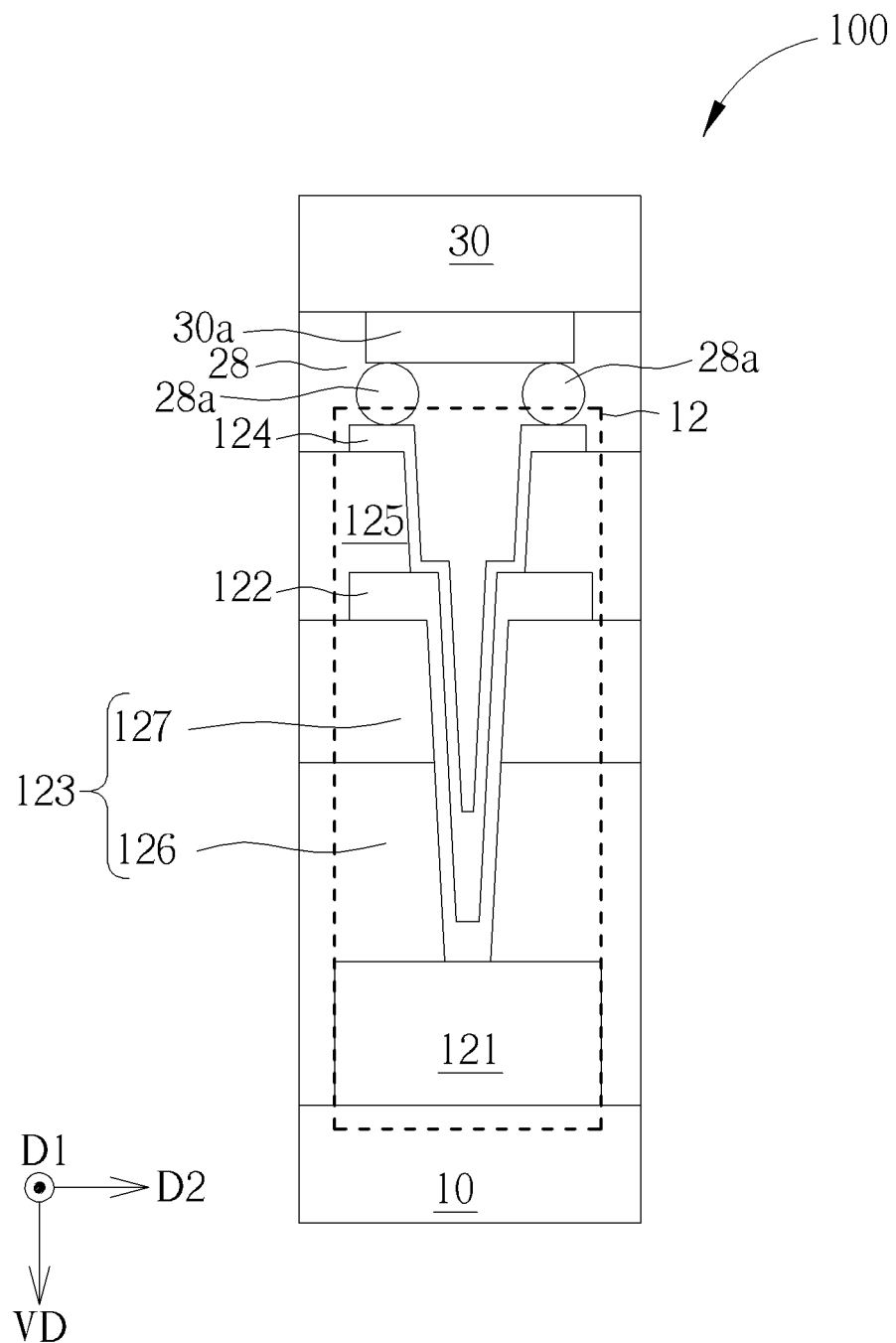

FIG. 1A to FIG. 3B schematically illustrate a method for manufacturing a flexible display device according to an embodiment of the present disclosure, wherein FIG. 1A schematically illustrates a top view of a flexible substrate and a bonding structure according to an embodiment of the present disclosure, FIG. 1B schematically illustrates a cross sectional view taken along a sectional line A-A' of FIG. 1A, FIG. 2 schematically illustrates a cross sectional view of an anisotropic conductive film provided on the bonding structure, FIG. 3A and FIG. 3B schematically illustrate a cross sectional view of the anisotropic conductive film being cured and a cross sectional view of a driving circuit provided on the anisotropic conductive film, respectively. The method for manufacturing the flexible display device will be described in detail in conjunction with FIG. 1A to FIG. 3B. As shown in FIG. 1A and FIG. 1B, first, a flexible substrate 10 and a bonding structure 12 are provided, wherein the bonding structure 12 is disposed on the flexible substrate 10. In this step, the flexible substrate 10 and the bonding structure 12 may be disposed on a carrier (such as a carrier 36 shown in FIG. 3A) or other suitable supporting platforms for performing subsequent processes. The flexible substrate 10 may be a substrate for the flexible display device, so that the flexible display device may be bendable. Material of the flexible substrate 10 may for example include polyimide (PI), polyethylene terephthalate (PET), polycarbonate (PC), polyether sulfone (PES), polybutylene terephthalate (PBT), polyethylene naphthalate (PEN), polyarylate (PAR), other suitable materials, or a combination thereof, but not limited thereto. In the embodiment shown in FIG. 1A, the quantity of the bonding structure 12 may be plural, but the quantity is not limited to those shown in the figure. In some embodiments, the quantity of the bonding structure 12 may be at least one.

To clearly describe the method of the present disclosure, the following contents use single bonding structure 12 as an illustrative example, but the quantity of the bonding structure 12 is not limited thereto. As shown in FIG. 1B, the bonding structure 12 includes a plurality of layers, in which these layers may include a conductive bonding pad 121, a first bonding pad 122 and an insulating layer 123. The conductive bonding pad 121 is disposed between the first bonding pad 122 and the flexible substrate 10, and the insulating layer 123 is disposed between the conductive bonding pad 121 and the first bonding pad 122. The insulating layer 123 may be a single-layer structure or a multi-layer structure. When a flexible display panel 1 is a fringe-field switching (FFS) liquid crystal display panel, the layers of at least one of the bonding structures 12 may further include a second bonding pad 124 disposed on the first bonding pad 122, so that the second bonding pad 124 may be electrically connected to the conductive bonding pad 121 via the first bonding pad 122. For example, the layers of the bonding structure 12 may further include an insulating layer 125 disposed between the second bonding pad 124 and the first bonding pad 122, and along a top-view direction VD, the insulating layer 125 may have at least one opening 125a overlapping with the second bonding pad 124 and the first bonding pad 122, such that the second bonding pad 124 may be electrically connected to the first bonding pad 122 through the opening 125a, thereby being further connected to the conductive bonding pad 121 electrically. In some embodiments, when the insulating layer 123 is a multilayer structure, the insulating layer 123 may for example include insulating layers 126, 127 disposed between the conductive bonding pad 121 and the first bonding pad 122. The insulating layer 126 may have at least one opening 126a, and the insulating layer 127 may have at least one opening 127a. In some embodiments, the opening 125a may overlap with the opening 126a and the opening 127a along the top-view direction VD. In some embodiments, the opening 125a may overlap with the opening 127a but not the opening 126a along the top-view direction VD. In some embodiments, the opening 125a may not overlap with both the opening 126a and the opening 127a along the top-view direction VD, but not limited thereto.

Please refer to FIG. 1C, which schematically illustrates a cross sectional view of the flexible substrate and the bonding structure corresponding to the sectional line A-A' of FIG. 1A according to some embodiments of the present disclosure. In some embodiments, the bonding structure 12 may not include the second bonding pad 124 and the insulating layer 125. In some embodiments, the insulating layer 123 may be a single-layer structure with at least one opening 123a, such that the first bonding pad 122 may be electrically connected to the conductive bonding pad 121 through the opening 123a. The quantity of the opening 123a may be single or plural. For example, the opening 123a may overlap with the conductive bonding pad 121 and the first bonding pad 122 along the top-view direction VD of the flexible substrate 10.

The conductive bonding pad 121, the first bonding pad 122 and the second bonding pad 124 may include transparent conductive materials such as indium tin oxide (ITO), indium zinc oxide (IZO), other suitable materials or a combination thereof, and/or they may include metals such as aluminum, copper, titanium, molybdenum nitride, other suitable materials or a combination thereof, but not limited thereto. The insulating layer 123, the insulating layer 125, the insulating layer 126, and the insulating layer 127 may include inorganic insulating materials, such as silicon nitride, silicon oxide, other suitable materials, or a combination thereof; they may also include organic insulating materials, such as polyfluoroalkoxy (PFA), polydimethylsiloxane (PDMS), polymethylmethacrylate (PMMA), other suitable materials, or a combination thereof. In the present disclosure, the "bonding structure" used herein may be defined as the conductive bonding pad 121 and a portion on the conductive bonding pad 121 in the step of providing the bonding structure 12. For example, in the embodiment shown in FIG. 1B, the first bonding pad 122, the second bonding pad 124, the insulating layer 125, the insulating layer 126, and the insulating layer 127 on the conductive bonding pad 121 in the top-view direction VD may be the bonding structure 12; in an embodiment shown in FIG. 1C, the first bonding pad 122 and the insulating layer 123 on the conductive bonding pad 121 in the top-view direction VD may be the bonding structure 12, but not limited thereto.

In some embodiments, a shape of the bonding structure 12 in the top-view direction VD may for example be rectangular, and a length of the bonding structure 12 in a direction D1 is greater than a length of the bonding structure 12 in a direction D2 perpendicular to the direction D1, but not limited thereto. In some embodiments, the bonding structure 12 may have other geometric shapes or curved edges, but not limited thereto.

In some embodiments, as shown in FIG. 1A and FIG. 1B, the step of providing the bonding structure 12 may further include providing conductive lines 14. The conductive lines 14 may for example extend along the direction D1 and be electrically connected to the conductive bonding pad 121 of the corresponding bonding structures 12 respectively. In some embodiments, the conductive lines 14 may be alternately arranged in the direction D2, and the bonding structures 12 respectively connected to two adjacent conductive lines 14 may have a staggered arrangement in the direction D2. In some embodiments, the conductive lines 14 and the conductive bonding pad 121 may include transparent conductive materials, such as indium tin oxide (ITO), indium zinc oxide (IZO), other suitable materials or a combination thereof; they may also include metals, such as aluminum, copper, titanium, molybdenum nitride, other suitable materials or a combination thereof, but not limited thereto. For example, the conductive lines 14 and the conductive bonding pad 121 may be formed of the same layer of material, but not limited thereto.

Figure 4:
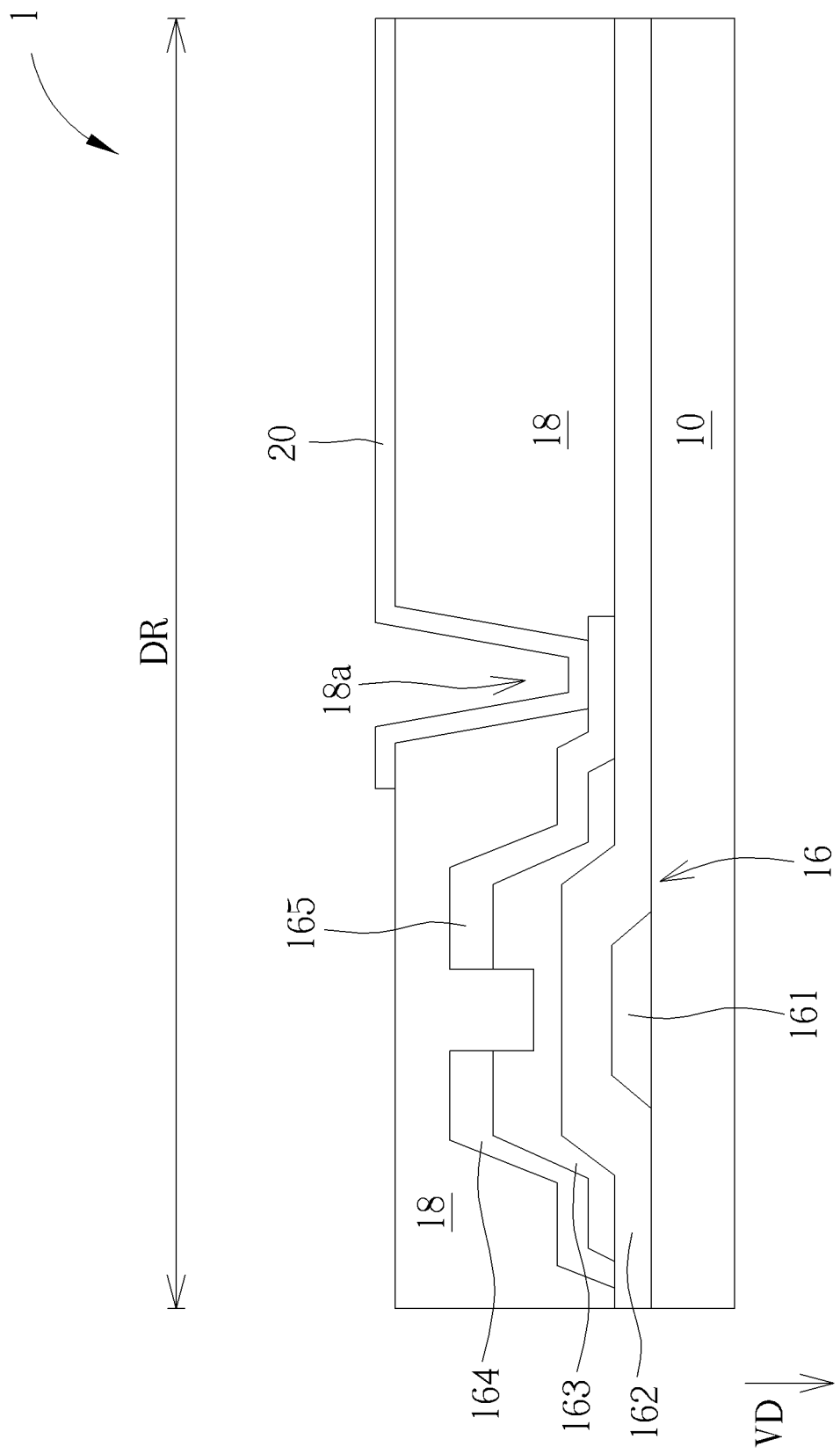
FIG. 4 schematically illustrates a cross sectional view of a thin film transistor and a pixel electrode according to some embodiments of the present disclosure.

Please refer to FIG. 4, which schematically illustrates a cross sectional view of a thin film transistor and a pixel electrode according to some embodiments of the present disclosure. In some embodiments, the step of providing the flexible substrate 10 and the bonding structure 12 may further include providing a plurality of thin film transistors 16 on the flexible substrate 10. For the sake of clarity, FIG. 4 illustrates a single thin film transistor, but not limited thereto. As shown in FIG. 1A and FIG. 4, the flexible display panel 1 may include the flexible substrate 10, the bonding structure 12 and the thin film transistor 16. In this configuration, the flexible display panel 1 may have a display region DR for displaying images and a peripheral region PR for disposing peripheral circuits, and the thin film transistor 16 may be disposed within the display region DR, while the bonding structure 12 may be disposed within the peripheral region PR. The thin film transistor 16 within the display region DR may be used for controlling or driving a pixel or sub-pixel of the flexible display panel 1 to display. In some embodiments, the flexible display panel 1 may also include other thin film transistors disposed within the peripheral region PR.

In some embodiments, as shown in FIG. 4, the thin film transistor 16 includes a plurality of film layers that include a gate 161, a gate insulating layer 162, a semiconductor layer 163, and source/drains 164, 165. Taking a bottom-gate type thin film transistor 16 as an illustrative example, the gate 161 is disposed on the flexible substrate 10; the gate insulating layer 162 is disposed on the gate 161 and the flexible substrate 10; the semiconductor layer 163 is disposed on the gate insulating layer 162 and overlaps with the gate 161 in the top-view direction VD; and the source/drains 164, 165 are disposed on the semiconductor layer 163 and respectively on opposite sides of the gate 161 in the top-view direction VD, but not limited thereto. In some embodiments, the gate 161 and the conductive bonding pad 121 of the bonding structure 12 includes the same materials, such as aluminum, molybdenum nitride, copper, titanium, other suitable materials, or a combination thereof. For example, the gate 161 and the conductive bonding pad 121 may be formed of the same metal layer, wherein the metal layer may be a single-layer structure or a multilayer structure.

Depending on the type of the thin film transistor 16, the gate 161, the gate insulating layer 162, the semiconductor layer 163 and the source/drains 164, 165 may also have different configurations. The thin film transistor 16 may for example be a top-gate type transistor, or, depending on demands, be altered to a double-gate type or dual-gate type transistor or other suitable transistors. Alternatively, the thin film transistor 16 may for example include an amorphous silicon (a-Si) transistor, a low-temperature poly-silicon (LTPS) transistor, a metal-oxide semiconductor (such as indium gallium zinc oxide, IGZO) transistor, but not limited thereto.

In some embodiments, the flexible display panel 1 may further include a planarizing layer 18 disposed on the thin film transistor 16. In some embodiments, the flexible display panel 1 may further include a pixel electrode 20 disposed on the planarizing layer 18; in such situation, the planarizing layer 18 may have one opening 18a, and the pixel electrode 20 is electrically connected to one of the source/drains 164, 165 of the corresponding thin film transistor 16 through the opening 18a. In some embodiments, the pixel electrode 20 may include transparent conductive materials, such as indium tin oxide, indium zinc oxide, other suitable materials or a combination thereof. In some embodiments, depending on the type of the flexible display panel 1, the flexible display panel 1 may further include other elements used for displaying images. For example, the flexible display panel 1 may be a non-self-luminous display panel. Taking a liquid crystal display panel as an illustrative example of the flexible display panel 1, the flexible display panel 1 may further include another flexible substrate (such as the flexible substrate 22 shown in FIG. 3A) and a liquid crystal layer (such as the liquid crystal layer 24 shown in FIG. 3A), wherein two flexible substrates are disposed opposite to each other and bonded to each other through a sealant (such as a sealant 26 shown in FIG. 3A, and the liquid crystal layer is disposed between the two flexible substrates 10, 22; in such situation, the another flexible substrate does not cover the bonding structure 12. In some embodiments, when the flexible display panel 1 is the FFS liquid crystal display panel, the flexible display panel 1 may further include a common electrode (not illustrated) disposed on the planarizing layer 18 to generate an in-plane electric field with the pixel electrode 20. In some embodiments, the flexible display panel 1 may also be a self-luminous display panel that may include light-emitting elements (not illustrated) disposed on the corresponding pixel electrode 20 and electrically connected to the corresponding pixel electrode 20. The light-emitting element may for example include OLEDs, mini LEDs, micro LEDs, QLEDs or QDLEDs. Material of the another flexible substrate may for example include PI, PET, PC, PES, PBT, PEN, PAR, other suitable materials, or a combination thereof, but not limited thereto.

In some embodiments, at least one film layer of the thin film transistor 16 may include the same material as a film layer of at least one bonding structure 12 and be formed by the same manufacturing process as the film layer of at least one bonding structure 12. In some embodiments, a portion of the thin film transistor 16 may include the same material as a portion of at least one bonding structure 12 and be formed by the same manufacturing process as the portion of at least one bonding structure 12. For example, in some embodiments, the gate 161 of the thin film transistor 16 and the conductive bonding pad 121 of the bonding structure 12 may include the same material. In some embodiments, the gate insulating layer 162 of the thin film transistor 16 and the insulating layer 126 of the bonding structure 12 may include the same material. In some embodiments, the pixel electrode 20 may include the same material as the first bonding pad 122 or the second bonding pad 124; for example, the pixel electrode 20 is formed of the same transparent conductive layer as the first bonding pad 122 or the second bonding pad 124. In some embodiments, when the flexible display panel 1 is the FFS liquid crystal display panel, the pixel electrode 20 and one of the first bonding pad 122 and the second bonding pad 124 may be formed of the same transparent conductive layer, and the common electrode and the other one of the first bonding pad 122 and the second bonding pad 124 may be formed of another transparent conductive layer. In some embodiments, the planarizing layer 18 may be the same insulating layer as one of the insulating layer 125 and the insulating layer 127. In some embodiments, one of film layers of the thin film transistor 16 and the corresponding film layer of the bonding structure 12 may be formed of the same material by different manufacturing processes or formed of different materials by different manufacturing processes.

As shown in FIG. 2, after the step of providing the flexible substrate 10 and the bonding structure 12 is completed, an anisotropic conductive film 28 is provided on the bonding structure 12. For example, the anisotropic conductive film 28 may include an insulating adhesive resin and a plurality of conductive particles disposed within the insulating adhesive resin (such as conductive particles 28a shown in FIG. 5B), but not limited thereto.

As shown in FIG. 3A and FIG. 3B, after the step of providing the anisotropic conductive film 28 is completed, a driving circuit 30 is provided on the anisotropic conductive film 28; subsequently, the anisotropic conductive film 28 is cured at a bonding temperature greater than or equal to 140° C. and less than or equal to 165° C., so that the driving circuit 30 is bonded and electrically connected to the bonding structure 12 through the anisotropic conductive film 28. In this step of curing the anisotropic conductive film 28, the anisotropic conductive film 28 reaches the same or similar temperature as the flexible substrate 10. In this manner, a flexible display device 100 may be produced. In some embodiments, the step of providing the driving circuit 30 includes disposing the driving circuit 30 on the anisotropic conductive film 28, and making the driving circuit 30 contact the anisotropic conductive film 28; then, the step of curing the anisotropic conductive film 28 may be performed through a top heating structure 32 disposed on the driving circuit 30 and a bottom heating structure 34 disposed under the flexible substrate 10, so as to perform thermal curing on the anisotropic conductive film 28. For example, the top heating structure 32 and the bottom heating structure 34 may be preheated; then, by contacting the driving circuit 30 and the flexible substrate 10, the anisotropic conductive film 28 may be thermally cured. In some embodiments, during the step of curing the anisotropic conductive film 28, the bonding temperature of the anisotropic conductive film 28 may also be greater than or equal to 150° C. and less than or equal to 160° C. In some embodiments, the flexible display device 100 may include the flexible display panel 1, the anisotropic conductive film 28 and the driving circuit 30.

The driving circuit 30 may for example be an integrated circuit chip, a flexible printed circuit board or other suitable elements, wherein the flexible printed circuit board may include a chip-on-film (COF) type circuit or other suitable types, but not limited thereto. The driving circuit 30 may for example include a plurality of bonding pads 30a, and each bonding pad 30a may be bonded and electrically connected to the corresponding bonding structure 12 respectively. In some embodiments, when the driving circuit 30 is the integrated circuit chip, a temperature of the top heating structure 32 may be greater than or equal to 195° C. and less than or equal to 205° C., and a temperature of the bottom heating structure 34 may be greater than or equal to 85° C. and less than or equal to 95° C., such that the bonding temperature of the anisotropic conductive film 28 may be within a range greater than or equal to 140° C. and less than or equal to 165° C. In some embodiments, when the driving circuit 30 is the flexible printed circuit board, the temperature of the top heating structure 32 may be greater than or equal to 235° C. and less than or equal to 245° C., the temperature of the bottom heating structure 34 may be greater than or equal to 105° C. and less than or equal to 115° C., such that the bonding temperature of the anisotropic conductive film 28 may be within a range greater than or equal to 140° C. and less than or equal to 165° C. In some embodiments, during the step of curing the anisotropic conductive film 28, the top heating structure 32 and the bottom heating structure 34 may be pressed to the flexible substrate 10 and the driving circuit 30, thereby improving the bonding therebetween.

It should be noted that, when the anisotropic conductive film 28 is cured at the bonding temperature greater than 165° C. (such as the bonding temperature of 170° C.), due to the large difference between the coefficient of thermal expansion (CTE) of the flexible substrate 10 and other film layers, peeling may occur at an interface between the bonding pad (such as the first bonding pad 122 or the second bonding pad 124) of the produced flexible display device and the insulating layer (such as the insulating layer 125 or the insulating layer 127) during reliability testing. In the present disclosure, by means of curing the anisotropic conductive film 28 at a bonding temperature greater than or equal to 140° C. and less than or equal to 165° C., peeling at the interface between the second bonding pad 124 and the insulating layer 125, the interface between the first bonding pad 122 and the insulating layer 125, or the interface between the first bonding pad 122 and the insulating layer 127 during reliability testing may be reduced or avoided, thereby improving the quality of the electrical connection between the driving circuit 30 and the bonding structure 12. In this manner, the display quality or reliability of the flexible display device 100 may be improved.

Figure 5A:
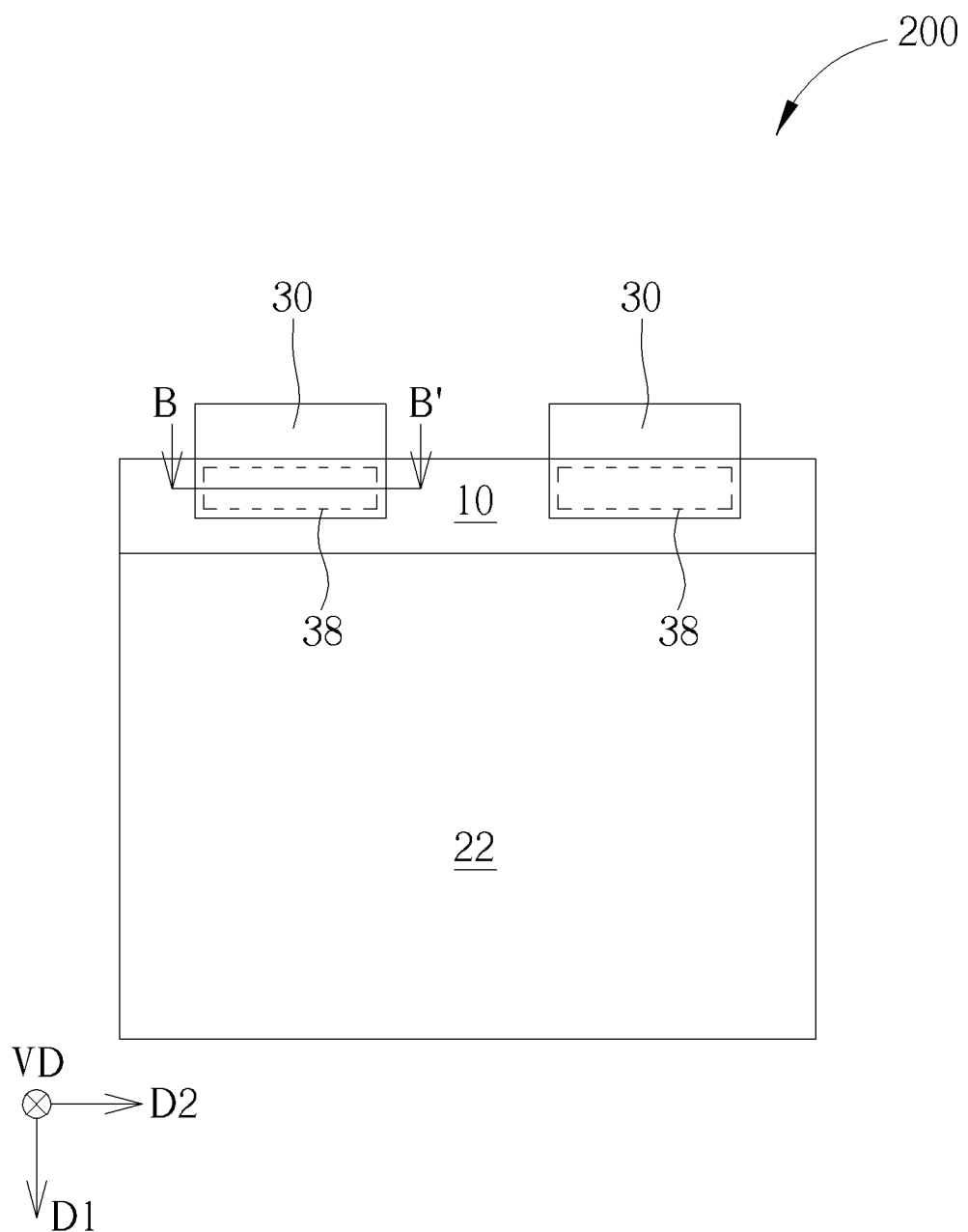
FIG. 5A schematically illustrates a top view of a flexible display device according to an embodiment of the present disclosure.
Figure 5B:
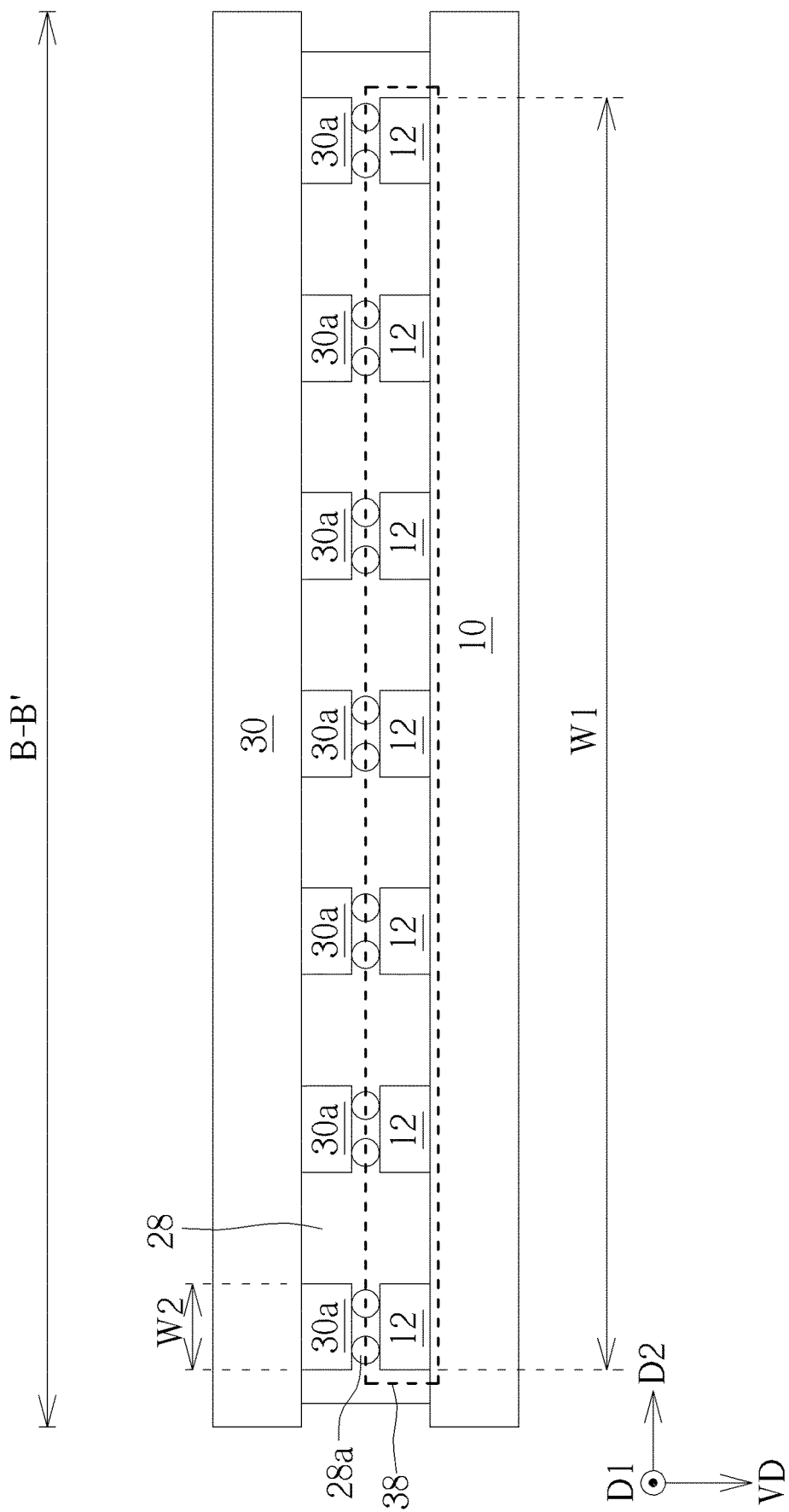
FIG. 5B illustrates a cross sectional view along a sectional line B-B' of FIG. 5A.

In the section below, a structure of the flexible display device formed by the aforementioned manufacturing method will be further described in detail. Please refer to FIG. 5A and FIG. 5B. FIG. 5A schematically illustrates a top view of a flexible display device according to an embodiment of the present disclosure, and FIG. 5B illustrates a cross sectional view taken along a sectional line B-B' of FIG. 5A. For clarity, FIG. 5B omits detailed film structures of the bonding structure, but the present disclosure is not limited thereto. As shown in FIG. 5A and FIG. 5B, a flexible display device 200 may include the flexible substrate 10, at least one bonding structure group 38, the driving circuit 30 and the anisotropic conductive film 28, wherein the bonding structure group 38 may include a plurality of bonding structures 12 arranged side-by-side. A quantity of the bonding structures 12 forming the bonding structure group 38 may be modified depending on a design or requirement of the corresponding driving circuit 30 electrically connected thereto. For example, the bonding structure group 38 may be consisted of seven bonding structures 12, and the corresponding driving circuit 30 that electrically connected to the bonding structure group 38 has seven bonding pads 30a, but not limited thereto. The flexible substrate 10, the bonding structure 12, the driving circuit 30 and the anisotropic conductive film 28 of the present embodiment may be structured as FIG. 3B and will not be repeated. In some embodiments, the flexible display device 200 may be identical to the structure shown in FIG. 3A which further includes another flexible substrate 22, the liquid crystal layer 24 and a seal 26, but not limited thereto.

In the present embodiment, the bonding structure group 38 has a first width W1 in the direction D2, and one of the bonding pads 30a of the driving circuit 30 has a second width W2 in the direction D2. If the flexible substrate 10 of the flexible display device 200 deforms due to temperature fluctuation, the bonding structure group 38 of the flexible substrate 10 may also experience change in width. If an overall width of the bonding structure group 38 changes too drastically, it is possible that at least one bonding structure 12 of the bonding structure group 38 may not be electrically connected to the bonding pad 30a of the driving circuit 30, thereby affecting normal operations of the flexible display device 200. In order for the driving circuit 30 to be electrically connected to the bonding structures 12 of the bonding structure group 38, the first width W1 and the second width W2 need to satisfy the following expression: (140−Trt)× CTE×W1<W2, where the value 140 is the temperature of the anisotropic conductive film 28 and the flexible substrate 10 reached during curing of the anisotropic conductive film 28, Trt is room temperature with a unit in degrees Celsius (° C.), CTE is a coefficient of thermal expansion of the flexible substrate 10 with a unit of $10^{-6}/°$ C., W1 is the first width, W2 is the second width, and units of W1 and W2 are micrometers. In some embodiments, a bonding temperature Tacf to cure the anisotropic conductive film 28 satisfies the following relationship: 140° C. Tacf 165° C. Room temperature may for example be 25° C. or from 15° C. to 30° C., but not limited thereto. The "first width W1" of the bonding structure group 38 of the present disclosure may be defined as a maximum width between exterior edges of the two outermost bonding structures 12 of the bonding structure group 38 arranged in the direction D2; for example, in the bonding structure group 38 shown in FIG. 5B, the first width W1 may be the maximum width between the left edge of the left most bonding structure 12 and the right edge of the right most bonding structure 12. The "second width W2" of the bonding structure group 38 of the present disclosure may be defined as a maximum width between two edges of single bonding structure 12 arranged in the direction D2.

It should be noted that, when curing the anisotropic conductive film 28, because the coefficient of thermal expansion of the flexible substrate 10 is greater than that of the other film layers of the flexible display device 200 (such as the insulating layer, the conductive bonding pad or the bonding pad of the bonding structure 12), a distance between adjacent bonding structures 12 on the flexible substrates 10 increases with increasing temperature. The increase in the first width W1 of the bonding structure group 38 as temperature increases is a sum of the changes of the distances between adjacent bonding structures 12 of the bonding structure group resulting from the change in temperature. The anisotropic conductive film 28 and the flexible substrate 10 may reach the same temperature during curing of the anisotropic conductive film 28; therefore, when the flexible substrate 10 is heated from room temperature to the bonding temperature of the anisotropic conductive film 28, the first width W1 of the bonding structure group 38 may change due to thermal expansion of the flexible substrate 10. As a result, the change in the first width W1 of the bonding structure group 38 may be expressed as (Tacf−Trt)×CTE×W1. In order for the driving circuit 30 and the bonding structures 12 of the bonding structure group 38 to be electrically connected to each other, the change in the first width W1 of the bonding structure group 38 needs to be less than the second width W2 of single bonding pad 30a of the driving circuit 30, so that during curing of the anisotropic conductive film 28, each bonding structure 12 of the bonding structure group 38 in the top-view direction VD may still overlap with the corresponding bonding pad 30a respectively, and that inadequate bonding between the bonding structure 12 and the corresponding bonding pad 30a may be reduced.

For example, when the flexible display device 200 is a liquid crystal display device, the flexible substrate 10 may include transparent PI with a CTE of about 38 ppm/° C. Or, when the flexible display device 200 is an OLED display device, the flexible substrate 10 may include yellow PI with a CTE of about 6.4 ppm/° C. Therefore, relationships between the first width W1 and the second width W2 corresponding to different types of the flexible display device 200 may be derived from the above expression, leading to a design of the flexible display device 200 with reduced inadequate bonding issues.

For clarity, FIG. 5A uses a dotted frame to represent the bonding structure group 38, and the bonding structure group 38 may be illustrated as shown in FIG. 5B, but not limited thereto. In some embodiments, the flexible display device 200 may include at least one bonding structure group 38 corresponding to the same driving circuit 30. For example, as shown in the embodiment of FIG. 5A, the flexible display device 200 may also include a plurality of bonding structure groups 38. It should be noted that, two adjacent bonding structure groups 38 do not have other bonding structures 12 between them, but the configuration is not limited thereto. The plurality of bonding structure groups 38 may be bonded to different driving circuits 30 respectively. For example, the driving circuit 30 may correspond to a gate driving circuit, a source driving circuit or driving circuits with other functions, but not limited thereto. In some embodiments, different driving circuits 30 may also be different portions of the same circuit board, but not limited thereto.

In summary, in the method for manufacturing the flexible display device of the present disclosure, because the anisotropic conductive film is cured at the bonding temperature greater than or equal to 140° C. and less than or equal to 165° C., peeling at the interface between the bonding pad and the insulating layer during reliability testing may be reduced, thereby improving the display quality or reliability of the flexible display device. In the flexible display device of the present disclosure, because the flexible display device satisfies the expression: Tacf<(W2/(CTE×W1))+Trt, during curing of the anisotropic conductive film, each bonding structure of the bonding structure group in the top-view direction may overlap with the corresponding bonding pad, thereby may reduce the occurrence of inadequate bonding between the bonding structure and the corresponding bonding pad.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for manufacturing a flexible display device, comprising:

providing a flexible substrate and a bonding structure, wherein the bonding structure is disposed on the flexible substrate;

providing an anisotropic conductive film on the bonding structure;

providing a driving circuit on the anisotropic conductive film, wherein the driving circuit is an integrated circuit chip; and curing the anisotropic conductive film, wherein the anisotropic conductive film is cured by a top heating structure disposed on the driving circuit and a bottom heating structure disposed under the flexible substrate, and a temperature of the bottom heating structure is greater than or equal to 85° C. and less than or equal to 95° C.;

wherein a bonding temperature of the anisotropic conductive film is greater than or equal to 140° C. and less than or equal to 165° C.

2. The method of claim 1, wherein the bonding temperature of the anisotropic conductive film is greater than or equal to 150° C. and less than or equal to 160° C.

3. The method of claim 1, further comprising providing a plurality of thin film transistors on the flexible substrate.

4. The method of claim 3, wherein a portion of one of the plurality of thin film transistors and a portion of the bonding structure are formed by a same process.

5. The method of claim 1, wherein a temperature of the top heating structure is greater than or equal to 195° C. and less than or equal to 205° C.

6. A method for manufacturing a flexible display device, comprising:

providing a flexible substrate and a bonding structure, wherein the bonding structure is disposed on the flexible substrate;

providing an anisotropic conductive film on the bonding structure;

providing a driving circuit on the anisotropic conductive film, wherein the driving circuit is a flexible printed circuit board; and curing the anisotropic conductive film, wherein the anisotropic conductive film is cured by a top heating structure disposed on the driving circuit and a bottom heating structure disposed under the flexible substrate, and a temperature of the bottom heating structure is greater than or equal to 105° C. and less than or equal to 115° C.;

wherein a bonding temperature of the anisotropic conductive film is greater than or equal to 140° C. and less than or equal to 165° C.

7. The method of claim 6, wherein a temperature of the top heating structure is greater than or equal to 235° C. and less than or equal to 245° C.

* * * * *